United States Patent [19]

Sporon-Fiedler

[11] Patent Number: 5,020,006
[45] Date of Patent: May 28, 1991

[54] METHOD FOR FINDING A REFERENCE POINT

[75] Inventor: Frederik Sporon-Fiedler, San Mateo, Calif.

[73] Assignee: Hewlett-Packard Company, Palo Alto, Calif.

[21] Appl. No.: 346,766

[22] Filed: May 3, 1989

[51] Int. Cl.$^5$ .............. G01N 21/86; G01B 11/00; G06F 15/31

[52] U.S. Cl. .............. 364/550; 364/559; 364/729.12; 250/561; 356/400; 358/101; 382/8

[58] Field of Search .............. 364/550, 551.01, 559, 364/574, 724.12, 728.01; 358/101, 107; 356/400; 250/548, 561; 382/8, 29, 54, 61

[56] References Cited

U.S. PATENT DOCUMENTS

| | | | |
|---|---|---|---|
| 4,149,259 | 4/1979 | Kowalski | 364/572 X |
| 4,641,257 | 2/1987 | Ayata | 364/559 |
| 4,672,676 | 6/1987 | Linger | 358/101 X |
| 4,713,784 | 12/1987 | Ayata | 364/559 |
| 4,752,898 | 6/1988 | Koenig | 364/559 |
| 4,761,738 | 8/1988 | Labregt et al. | 364/572 X |
| 4,803,644 | 2/1989 | Frazier et al. | 364/559 |
| 4,809,066 | 2/1989 | Leberl et al. | 358/107 |
| 4,905,296 | 2/1990 | Nishihara | 364/728.01 X |

OTHER PUBLICATIONS

Murakami, et al.—Laser Step Alignment for Wafer Stepper—SPIE, vol. 538, Optical Microlitholgraphy IV (1985) pp. 9–16.

G. Owen–Shot Noise Errors in Registration for Electron Lithography, (1986) The Institute of Physics, pp. 2209–2233.

Slonaker, et al.-Enhanced Global Alignment for Production Optical Lithography-Internal Nikon Publication.

Tsen-gong Jum Hsu-Digital Adaptive Matched Filter for Fiducial Mark Registration-(1981, May) Hewlett Packard Journal.

Primary Examiner—Joseph L. Dixon

[57] ABSTRACT

A method for locating the signal from a fiducial mark which is separated by a known distance from a second fiducial mark is disclosed. The signals from the fiducial marks are presumed to be corrupted by noise. The method utilizes the known spacing of the fiducial marks to construct a filter function which, when convolved with the corrupted signal, produces an enhanced signal having a peak at the location of the fiducial mark.

5 Claims, 2 Drawing Sheets

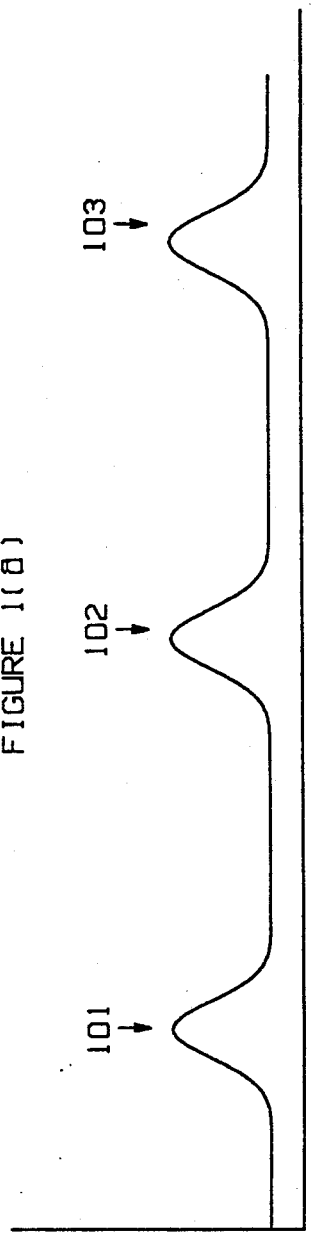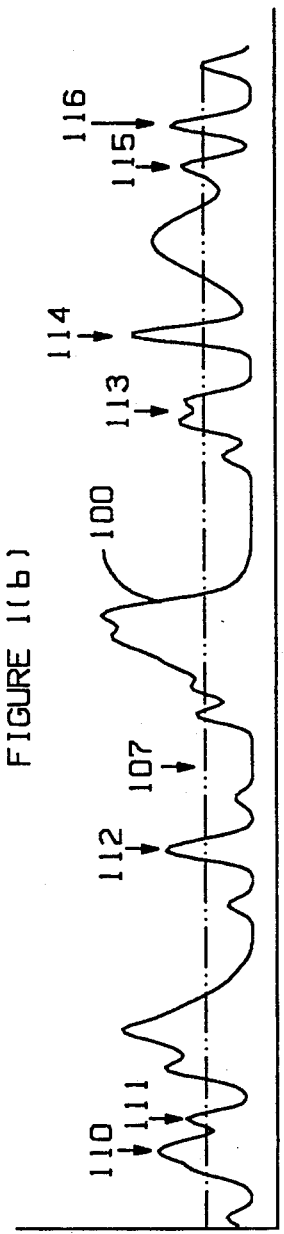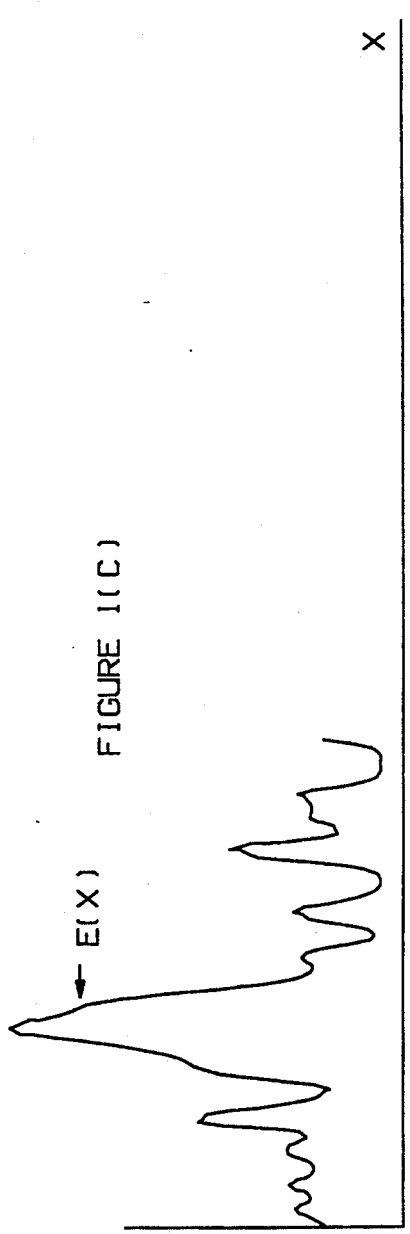

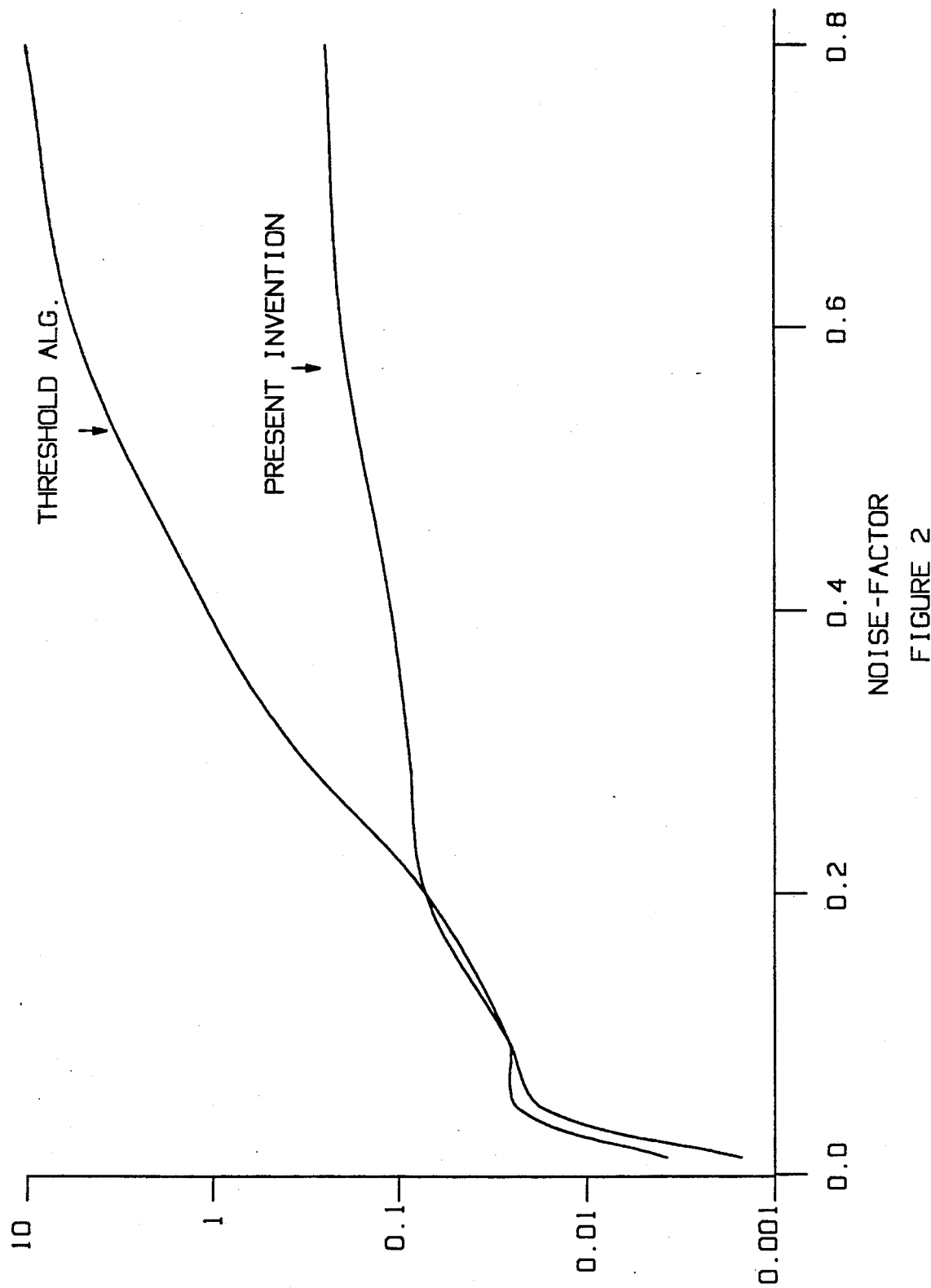

METHOD FOR FINDING A REFERENCE POINT

FIELD OF THE INVENTION

The present invention relates to methods for finding the location of an unknown reference point with respect to a known reference point in a signal comprising an ordered sequence of measurements, and more particularly, to a method for aligning an object by locating fiducial marks thereon.

BACKGROUND OF THE INVENTION

The need to align an object repetitively arises in a number of manufacturing processes. For example, in the fabrication of integrated circuits, each semiconductor device results from a series of chemical and depositional processes. The success of the fabrication process depends on the wafer being in a known position when each of these process steps is performed. If the wafer is misaligned during one of these process steps, the resultant integrated circuits may be defective.

The precise positioning of the wafer in the processing equipment is typically accomplished by providing a number of fiducial marks on the surface of the wafer. The wafer is positioned utilizing a "coarse-fine" positioning scheme. The coarse adjustments position the wafer such that one or more of the desired fiducial marks are within the field of view of a scanning device. The position of the desired fiducial mark is located by scanning the surface of the wafer in the vicinity of the fiducial mark being sought. The signal from the scanning device is then processed to determine the location of the fiducial mark Once such a determination is made, fine adjustments in the position of the wafer are made.

The accuracy of the fine adjustment depends on the precision with which the location of the fiducial mark can be determined. When the waveform from the scanner is not corrupted by noise, the location of the fiducial mark can be determined by relatively simple computer algorithms. For example, one prior art algorithm detects the peak of the signal from the scanning device and then locates the points at which the signal crosses one or more threshold values. The threshold values are set in relation to the peak height. In the simplest form of thresholding algorithm, a single threshold value is utilized, typically, one half the peak height. The fiducial location is then assigned to a location computed from the average of the locations at which the signal crosses the threshold value.

This type of simple prior art scheme for locating the fiducial marks fails when the signal is corrupted by noise. Noise can result from electronic noise or from surface imperfections on the wafer in the vicinity of the fiducial mark. Such imperfections can result from damage during previous processing steps or from particulate matter on the surface of the wafer. In any event, if the signals arising from this noise are above the threshold value in locations off of the fiducial mark, these signals will lead to errors in the determination of the fiducial location. In addition, noise which reduces the signal value at locations on the fiducial mark also may lead to errors in fiducial location. Such noise can reduce the signal intensity in the fiducial region to a value below the threshold value.

A second problem with this type of fiducial mark location algorithm results from the need to set a threshold value. If the fiducial marks vary in "brightness" across the wafer, the correct threshold value in one portion of the wafer will differ from that in another portion of the wafer. In addition, the brightness of any given fiducial mark typically changes in the course of wafer processing.

A number of prior art solutions to the above mentioned problems with this type of simple fiducial mark location scheme have been proposed. For example, Murakami, et al. ["Laser Step Alignment for a Wafer Stepper", SPIE 538 Optical Microlithography IV (1985)]teach a scheme in which the fiducial marks consist of small diffraction gratings. These gratings are scanned utilizing a laser. Since the diffraction grating properties of the fiducial marks are utilized in recognizing the marks, problems arising from noise or surface imperfections which would otherwise give rise to "false" fiducial marks are reduced.

However, this type of scheme has a number of significant drawbacks. First, if the fiducial mark has a rough surface, is damaged during processing, or is corrupted by particulate matter, the diffraction grating effect may be substantially reduced. The accuracy with which the fiducial mark may be located is then significantly reduced. Second, the method requires a different type of detection apparatus from that included in many alignment stages. Hence, a significant cost must be incurred to retrofit existing equipment if this method is to be utilized.

A second prior art scheme for improving fiducial mark detection is taught by G. Owen ["Shot Noise Errors in Registration for Electron Lithography," J. Phys. D : Appl. Phys., 19, pp. 2209–2223, (1986)]. In this scheme, a fiducial mark consisting of a trench etched in the substrate surface or of some other feature constructed by depositing a heavy metal on the surface of the substrate is utilized. The fiducial mark is scanned with an electron beam and the back-scattered electrons are detected as a function of the electron beam position to provide a registration signal.

The location of the fiducial mark in the registration signal is detected by finding the maximum of a detection function constructed by convolving the registration signal with a "template" representing an ideal, noise-free, registration signal. This convolution is calculated for each possible position of the fiducial mark relative to the start of the electron beam scan. The fiducial mark is assigned a location determined from an analysis of the convolution function the vicinity of the maximum of the convolution function. The simplest form of analysis assigns the fiducial mark location to the maximum of the convolution. However, it will be apparent to those skilled in the art that a thresholding algorithm similar to that used in analyzing the measured data in prior art devices may be used to analyze the convolution function.

Although this scheme provides improved noise immunity relative to the simple threshold scheme described above, without requiring specialized detection equipment, its accuracy is still dependent on having a relatively "clean" fiducial mark. If the fiducial mark is damaged in a manner which causes its detection signal to differ significantly from that expected from an ideal fiducial mark, significant location error can occur.

Broadly, it is the object of the present invention to provide an improved method for locating a fiducial mark in a signal.

It is a further object of the present invention to provide a method which is less sensitive to noise than prior art methods.

It is yet another object of the present invention to provide a method that is less sensitive to distortions in the signal which cause the signal to differ from an ideal signal.

These and other objects of the present invention will become apparent to those skilled in the art from the following detailed description of the invention and the accompanying drawings.

BRIEF DESCRIPTION OF THE DRAWINGS

FIG. 1(a) illustrates an ideal noise-free signal used to generate a measured signal in a simulation experiment for demonstrating the advantages of the present invention.

FIG. 1(b) illustrates a simulated measured signal of the type encountered in locating fiducial marks on a semiconductor wafer.

FIG. 1(c) illustrates the enhanced measurement signal generated by the present invention from the data given in FIGS. 1(a) and (b).

FIG. 2 is a comparison of the alignment error obtained utilizing the present invention with that obtained utilizing the prior art threshold method.

SUMMARY OF THE INVENTION

The present invention comprises a method for locating the signal from a first fiducial mark, having a width of $\pm w_1$, which is separated by a distance D from a second fiducial mark, having a width $\pm w_2$, when said signal is corrupted by a noise signal to form a joint fiducial mark and noise signal, M(x). The present invention operates by convolving M(x) with a filter function F(x) to form an enhanced function E(x). Here, $F(x+c)>0$ for at least one value of x between $-w_1$ and $+w_1$, $F(x+c)=0$ for x between $D+w_1$ and $D-w_2$, and $F(x+c)>0$ for at least one value of x between $D-w_2$ and $D+w_2$, where c may be any constant. The maximum value of E(x) is related to the location of the signal from the first fiducial mark in M(x).

DETAILED DESCRIPTION OF THE INVENTION

The above described prior art fiducial mark detection schemes determine the location of the fiducial mark by examining only the scanner data in the vicinity of the fiducial mark. Hence, any localized damage or imperfection in the wafer in the vicinity of the fiducial mark can result in significant errors in the determination of the fiducial mark location.

In contrast, the present invention utilizes scanner data from an area encompassing the fiducial mark in question and at least one additional fiducial mark. Hence, the present invention is less sensitive to localized imperfections in the wafer. In addition, by combining data from a number of scanner points, the errors resulting from noise are also reduced.

The method of the present invention operates as follows. Consider a series of measurements in which an area extending across a plurality of fiducial marks is scanned. The goal is to detect the location of one of these fiducial marks. For the purposes of this discussion, this fiducial mark will be referred to as the desired fiducial mark. For convenience, the fiducial mark in question will be labeled "1". The remaining fiducial marks will be labeled 2, ...,N, where N is the number of fiducial marks scanned. The distances from fiducial mark 1 to each of fiducial marks 2, ..., N will be denoted by $P_2,...,P_N$. Let M(x) be the data measured by the scanner at position x on the wafer surface. An enhanced signal measurement E(x) is constructed by convolving M(x) with a filter function F(x), i.e., $$E(x) = \int F(x-t)M(t)\, dt \quad (1)$$

The maximum of E(x) in the vicinity of the desired fiducial mark is then taken as the location thereof. The filter function F(x) is constructed utilizing the known locations of the fiducial marks relative to the desired fiducial mark. In general, F(x) will be non-zero at x-values corresponding to the locations, relative to the desired fiducial mark, at which other fiducial marks exist.

In one preferred embodiment of the present invention, F(x) consists of a number of delta functions at the center positions of the various fiducial mark locations relative to the desired fiducial mark location. That is, $$F(x) = \delta(0) + \sum_{i=2}^{N} \delta(x - P_i) \quad (2)$$

where, $$\begin{aligned}\delta(x) &= 0 \text{ if } x \neq 0 \\ &= \infty \text{ if } x = 0\end{aligned} \quad (3)$$

$$\int \delta(x) = 1.$$

In this case, $$E(x) = M(x) + \sum_{i=2}^{N} M(x + P_i) \quad (4)$$

FIGS. 1(a)–(c) illustrate the advantages of the present invention in determining the position of a fiducial mark when significant noise is present in the signal. The results presented in FIGS. 1(a)–(c) are from a simulation of the types of data encountered in positioning semiconductor wafers during the processing thereof.

FIG. 1(a) illustrates the ideal noise-free signal. The signal has three Gaussian shaped peaks shown at 101–103. This ideal signal has been corrupted by the addition of 35 noise peaks to produce the simulated measured signal 100 shown in FIG. 1(b). The noise peaks were chosen to have a width which was one quarter of the width of peaks 101–103. The amplitudes of the noise peaks were chosen randomly between 0 and 0.7 times the amplitude of peaks 101–103. The positions of the noise peaks were selected randomly over the range of X measurements shown in the figures. This type of noise is typical of that observed in semiconductor processing. In semiconductor processing, the signal from the scanning has very little electronic noise. Most of the noise results from the grain size of the films on the semiconductor surface or from other imperfections in the surfaces.

The threshold level utilized by the prior art method described above is shown at 107. It is apparent from FIG. 1(b) that numerous noise peaks would exceed this level. For example peaks 110–116 all exceed this threshold level and lead to errors in the determination of the locations of the peaks corresponding to the fiducial marks.

A filter function consisting of three delta functions was utilized in applying the present invention to signal 100. The first delta function was located at x=0. The second delta function was located at $P_2$, where $P_2$ is the distance between peaks 101 and 102. The third delta function was located at $P_3$, where $P_3$ is the distance between peaks 101 and 103. The enhanced signal E(x) in the region of peak 101 is shown in FIG. 1(c). It is apparent from an examination of FIG. 1(c) that this enhanced signal has a clear maximum at the location of peak 101.

It should be noted that the filter function could have been constructed with the first delta function at x=c, the second at $x=P_2+c$, and the third at $x=P_3+c$, where c is any constant. The advantage of utilizing a filter function with c=0 is that the x-value for which E(x) is maximum is also the offset of the fiducial mark in the measured signal. If a value of c different from 0 is utilized, then c would have to be subtracted from the x-value at which E(x) is maximum to obtain the offset in question.

The degree of improvement of the present invention over the threshold algorithm described above may be more easily seen with reference to FIG. 2. FIG. 2 is a semi-log plot of the error in locating the first fiducial mark, i.e., peak 101, as a function of the amount of noise introduced into the ideal signal shown in FIG. 1(a) to produce the simulated measured signal 100. As mentioned above, the data shown in FIG. 1(b) was generated by using noise peaks having amplitudes chosen between 0 and 0.7 of the amplitude of peaks 101-103. The maximum noise peak will be referred to as the "Noise Factor". FIG. 2 illustrates the alignment error as a function of this Noise Factor. It is apparent from an examination of FIG. 2 that the method of the present invention provides a factor of 100 improvement over the prior art threshold measurement.

The above described method for locating the fiducial marks utilized a filter function, F(x), which was a sum of simple delta functions. However, it will be apparent to those skilled in the art that other filter functions may be advantageously utilized.

In general, one can construct a filter function according to the present invention by referring to the noise-free signal that would be obtained if two or more ideal fiducial marks were scanned in a noise-free environment with the first fiducial mark centered at x=0. For simplicity, the case in which two such fiducials marks are scanned will be utilized. The goal of scanning the fiducial marks is to locate the first of these marks. Three regions of interest can be defined. The first region is that occupied by the first fiducial mark. The second is the region between the two fiducial marks, and the third is the region occupied by the second fiducial mark. F(x) must be non-zero at one or more points in the first and third regions and zero in the second region. In the above described example, F(x) was calculated assuming that the fiducial marks were replaced by ideal "point" marks. Hence, delta functions were utilized.

It will be apparent to those skilled in the art that F(x) could be constructed utilizing an ideal noise-free template such as that taught by Owen for each of the fiducial marks. In this case, F(x) would be proportional to the scanner output that would be obtained if the desired fiducial mark were located at x=0 and the area including said fiducial mark and at least one other fiducial mark were scanned.

The above embodiments of the present invention have been described in terms of locating one of a plurality of fiducial marks on a wafer. However, it will be apparent to those skilled in the art that the method of the present invention can be utilized to find the start of any signal having peaks separated by a know distance when that signal has been corrupted by noise or other signals which have a different structure. For the method of the present invention to be successful, the noise must not have the same spatial correlation as the signal of interest. That is, $$\int N(x)N(x+P)dx \approx 0,$$

where N(x) is the corrupting noise signal.

Accordingly, there has been described herein a method for locating the start of a signal that has been corrupted by noise or other artifacts. Various modifications to the present invention will become apparent to those skilled in the art from the foregoing description and accompanying drawings. Accordingly, the present invention is to be limited solely by the scope of the following claims.

I claim:

1. In conjunction with an apparatus including means for positioning an object and means for scanning the surface of said object to produce a signal indicative of the properties of the surface of said object along a predetermined scan path, a method for operating said apparatus so as to locate the signal from a first fiducial mark, having a width $\pm w_1$, which is separated by a distance D from a second fiducial mark, having a width $\pm w_2$, when said signal is corrupted by a noise signal, said method comprising the steps of:

scanning the surface of said object along a path passing through said first and second fiducial marks thereby generating a signal M(x) indicative of the surface of said object along said path, wherein x is the distance along said path;

convolving M(x) with a filter function F(x) to form an enhanced function E(x), wherein $F(x+c)>0$ for at least one value of x between $-w_1$ and $+w_1$, $F(x+c)=0$ for x between $D+w_1$ and $D-w_2$, and $F(x+c)>0$ for at least one value of x between $D-w_2$ and $D+w_2$, where c is a constant;

analyzing E(x) to determine the location the portion of E(x) resulting from said first fiducial mark, and moving said object to a position related to said first fiducial mark.

2. The method of claim 1 wherein said step of analyzing E(x) comprises finding the maximum value of E(x).

3. The method of claim 1 wherein F(x) is proportional to the signal which would be obtained if said first and second fiducial marks were scanned in a noise-free environment.

4. The method of claim 1 wherein F(x) comprises two delta functions.

5. The method of claim 4 wherein said delta functions are separated by a distance D.

* * * * *